United States Patent
Matsumoto et al.

(10) Patent No.: US 9,608,045 B2
(45) Date of Patent: Mar. 28, 2017

(54) DISPLAY DEVICE

(71) Applicant: Japan Display Inc., Tokyo (JP)

(72) Inventors: Yuko Matsumoto, Tokyo (JP); Masahiko Suzuki, Tokyo (JP); Hiroshi Oooka, Tokyo (JP); Takeshi Ookawara, Tokyo (JP); Kouhei Takahashi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/551,136

(22) Filed: Nov. 24, 2014

(65) Prior Publication Data

US 2015/0144919 A1    May 28, 2015

(30) Foreign Application Priority Data

Nov. 25, 2013  (JP) ................... 2013-243313

(51) Int. Cl.
*H01L 27/32* (2006.01)
*H01L 51/50* (2006.01)
*H01L 51/52* (2006.01)

(52) U.S. Cl.
CPC ............ *H01L 27/322* (2013.01); *H01L 51/52* (2013.01); *H01L 51/5209* (2013.01); *H01L 51/5225* (2013.01)

(58) Field of Classification Search
None
See application file for complete search history.

(56) References Cited

U.S. PATENT DOCUMENTS

| 2005/0062407 | A1* | 3/2005 | Suh ................. H01L 27/322 313/504 |
| 2008/0211385 | A1* | 9/2008 | Kim ................. H01L 51/0096 313/498 |
| 2010/0171107 | A1* | 7/2010 | Jung ................. H01L 27/322 257/40 |
| 2012/0012834 | A1* | 1/2012 | Sonoda ............. G02B 5/201 257/40 |

FOREIGN PATENT DOCUMENTS

JP    2011-18468 A    1/2011

* cited by examiner

*Primary Examiner* — Calvin Choi
*Assistant Examiner* — Xiaoming Liu
(74) *Attorney, Agent, or Firm* — Typha IP LLC

(57) ABSTRACT

A display device includes a first substrate, an organic EL layer formed on the first substrate and curved in each pixel, and color filters disposed in the respective pixels, and curved to match the organic EL layer. With this configuration, a change in the chromaticity and brightness of the display device depending on a viewing angle of a user is reduced.

6 Claims, 5 Drawing Sheets

DISPLAY DEVICE

CROSS-REFERENCE TO RELATED APPLICATION

The present application claims priority from Japanese application JP2013-243313 filed on Nov. 25, 2013, the content of which is hereby incorporated by reference into this application.

BACKGROUND OF THE INVENTION

1. Field of the Invention

The present invention relates to a display device having a color filter.

2. Description of the Related Art

JP 2011-18468 A discloses a structure in which an organic EL layer formed in each pixel is curved to be swelled. In the structure of JP 2011-18468 A, light can be emitted not only in a direction perpendicular to a display device, but also in a direction oblique to the display device due to the curvature of the organic EL layer. As a result, the chromaticity and brightness of the display device are prevented from being changed depending on a viewing angle of a user.

SUMMARY OF THE INVENTION

Some of the organic EL display devices are equipped with a color filter. If the color filter is applied to the display device having the structure described above which actively emits light in an oblique direction, a distance by which light emitted from the organic EL layer in a direction oblique to the display device passes through the color filter is larger than a distance by which light emitted in a direction perpendicular to the display device passes through the color filter. This again causes such a problem that the chromaticity and brightness of the display device are changed depending on the viewing angle of the user.

One object of the present invention is to provide an organic EL display device having a color filter and an organic EL layer curved in each pixel, which restrains the chromaticity and brightness of the display device from being changed depending on a viewing angle of a user.

(1) According to one configuration of the present invention, there is provided a display device including a first substrate; a plurality of pixels disposed on the first substrate; an organic EL layer having a curved portion curved in a cross-sectional view, which is disposed in at least one of the plurality of pixels; and a color filter having a curved portion curved to match the curved portion of the organic EL layer, which is disposed in at least one of the plurality of pixels. According to this aspect, the chromaticity and brightness of at least one pixel can be restrained from being changed depending on a viewing angle of a user.

(2) In the configuration of (1), a second substrate that faces the first substrate may be provided, and the color filter may be formed on the second substrate side. According to this structure, an influence (for example, penetration of moisture into the organic EL layer) on the organic EL layer in forming the color filter can be suppressed.

(3) In the configuration of (1) or (2), the organic EL layer may have a light emitting surface that emits light to a side corresponding to a display surface of the display device, and the curved portion of the organic EL layer may be curved to concave the light emitting surface. According to this configuration, since the organic EL layer is curved to concave the light emitting surface, light emitted from the organic EL layer of a certain pixel can be restrained from being mixed with light of an adjacent pixel, as compared with a structure in which the organic EL layer is curved to swell the light emitting layer.

(4) In the configuration of (2), the organic EL layer may have a light emitting surface that emits light to a side corresponding to a display surface of the display device, the curved portion of the organic EL layer may be curved to concave the light emitting surface, the second substrate may have a convex portion having a curved portion curved to match the curved portion of the organic EL layer on a surface thereof, and the color filter may be formed on the curved portion of the convex portion. According to this configuration, since the organic EL layer is curved to concave the light emitting surface, light emitted from the organic EL layer of a certain pixel can be restrained from being mixed with light of an adjacent pixel, as compared with a structure in which the organic EL layer is curved to swell the light emitting layer.

(5) In the configuration of (4), the convex portion of the second substrate may be smaller than the concave portion disposed in the first substrate in a plan view. According to this configuration, a distance between the organic EL layer and the color filter is easily reduced. As a result, a change in the chromaticity and brightness of the display device depending on the viewing angle of the user can be more effectively reduced.

(6) In the configuration of (1), a second substrate that faces the first substrate may be provided, and the color filter may be formed on the first substrate side. According to this configuration, the distance between the organic EL layer and the color filter is easily reduced. As a result, the change in the chromaticity and brightness of the display device depending on the viewing angle of the user can be more effectively reduced.

(7) In the configuration of (6), an insulating layer having a concave portion in the at least one pixel may be disposed on the first substrate, and the organic EL layer and the color filter may be stacked on the concave portion of the insulating layer. According to this configuration, the organic EL layer is curved to concave the organic EL layer in at least one pixel. As a result, light emitted from the organic EL layer of at least one pixel can be restrained from being mixed with light of an adjacent pixel, as compared with a structure in which the organic EL layer is curved to be swelled.

DETAILED DESCRIPTION OF THE INVENTION

Figure 1:
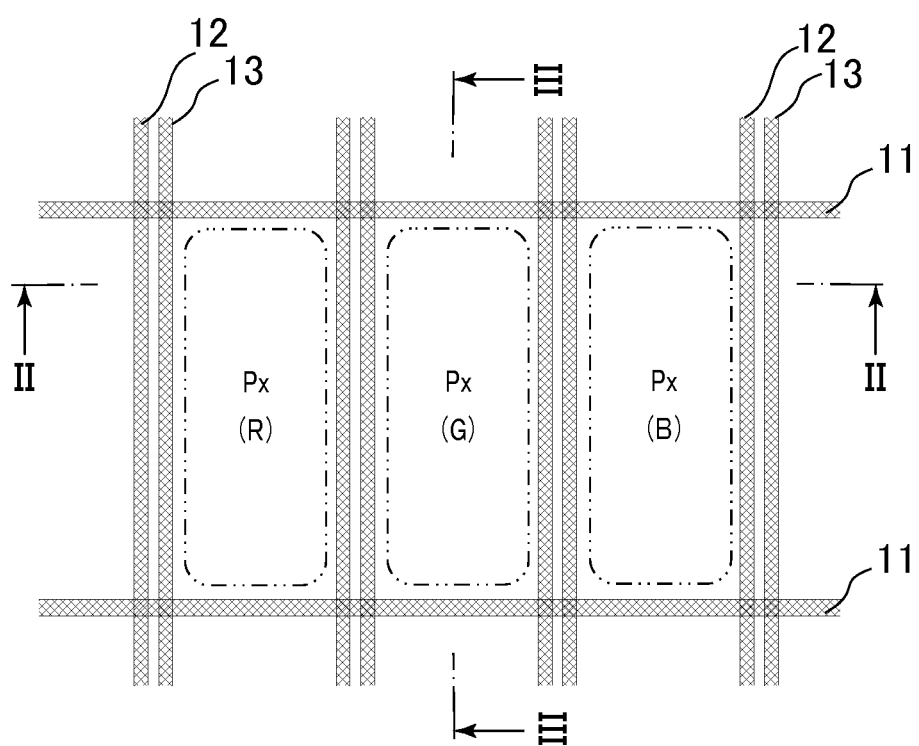
FIG. 1 is a plan view illustrating an outline of a first substrate provided in an organic EL display device according to the present invention.

Hereinafter, an embodiment of the present invention will be described with reference to the accompanying drawings. The disclosure of the present specification is merely exemplary, and appropriate variations suitably conceivable by those skilled in the art are also encompassed within the scope of the invention as long as they fall within the spirit of the invention. Also, for facilitation of understanding the embodiment, widths, thicknesses, and shapes of respective components in the drawings may be schematically illustrated, and the drawings are exemplary and do not limit the interpretation of the present invention.

Figure 2:
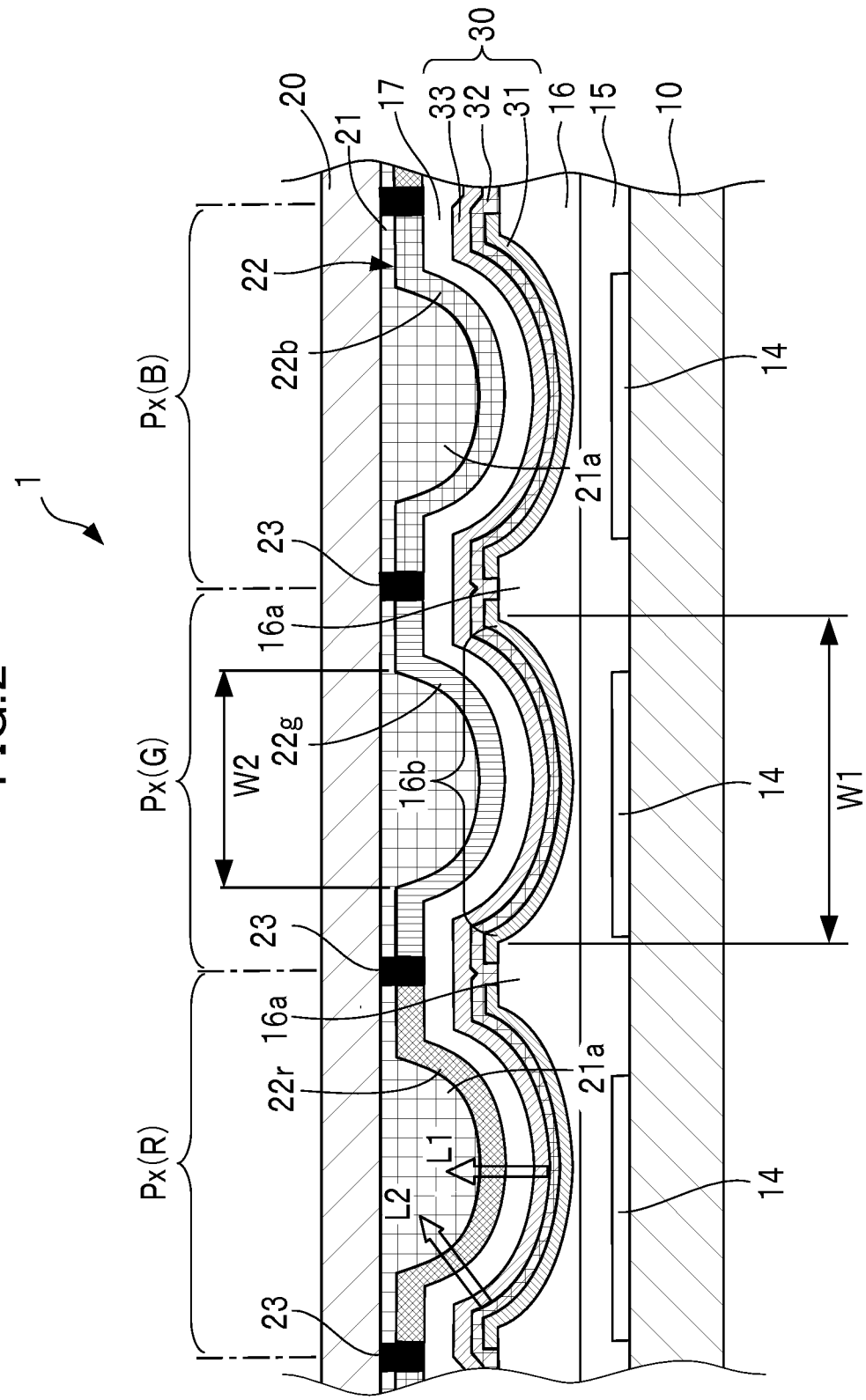
FIG. 2 is a cross-sectional view of the outline of the organic EL display device taken along a line II-II in FIG. 1.
Figure 3:
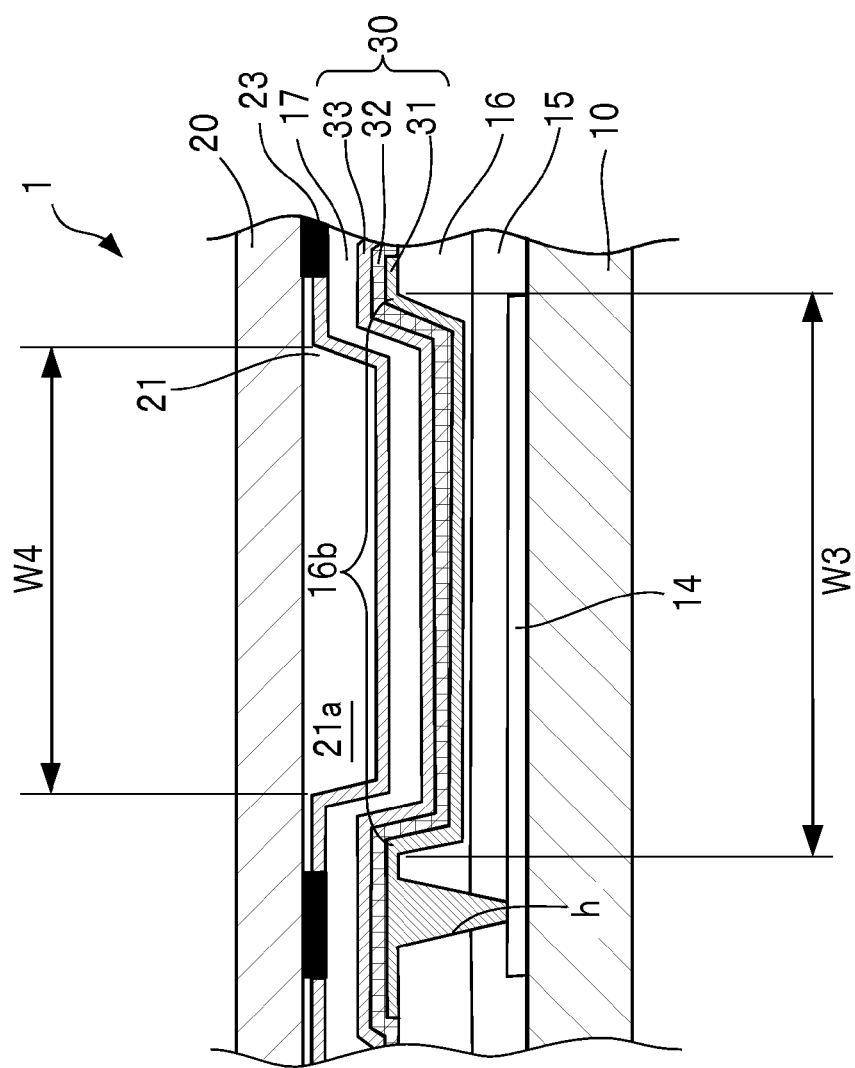
FIG. 3 is a cross-sectional view of the outline of the organic EL display device taken along a line III-III in FIG. 1.

FIG. 1 is a plan view illustrating an outline of a first substrate 10 provided in an organic EL display device 1 according to an embodiment of the present invention. FIG. 2 is a cross-sectional view illustrating the outline of the organic EL display device 1 taken along a line II-II in FIG. 1. FIG. 3 is a cross-sectional view of the outline of the organic EL display device 1 taken along a line III-III in FIG. 1. Hereinafter, the organic EL display device 1 is merely called "display device 1".

As illustrated in FIG. 2, the display device 1 includes the first substrate 10 on which a laminated structure including an organic EL layer 32 is formed. Also, the display device 1 has a second substrate 20 which is formed with a laminated structure including a color filter layer 22, and faces the first substrate 10. Each of the first substrate 10 and the second substrate 20 are formed of, for example, a glass substrate, but may be formed of a substrate made of another material such as a plastic substrate.

As illustrated in FIG. 1, the first substrate 10 are formed with scanning lines 11 arranged at intervals from each other, and video signal lines 12 arranged at intervals from each other. The scanning lines 11 and the video signal lines 12 are formed in two directions orthogonal to each other, and formed in a matrix as a whole. Each of pixels Px is surrounded by two adjacent scanning lines 11 and two adjacent video signal lines 12. In an example, as illustrated in FIG. 1, the organic EL display device 1 includes red pixels Px(R), green pixels Px(G), and blue pixels Px(B). In an example of FIG. 1, three colors of pixels are aligned in a direction along the scanning lines 11. A structure of the organic EL display device 1 is not limited to this configuration. For example, the display device 1 may include four colors (for example, red, green, blue, and white) of pixels. In this case, four colors of pixels may be aligned along the scanning lines 11, or two colors of pixels among those four colors of pixels are aligned along the scanning lines 11, and the remaining two colors of pixels among those four colors of pixels may be aligned in a direction along the video signal lines 12. On the first substrate 10, current supply lines 13 are formed along the respective video signal lines 12.

As illustrated in FIG. 2, circuit sections 14 are formed on the display device 1. Each of the circuit sections 14 includes a thin film transistor (TFT) for driving an OLED (organic light emitting diode) section 30 having an organic EL layer 32, the scanning lines 11, the video signal lines 12, and the current supply lines 13 described above which are connected to the TFT. The TFT is disposed in each of the pixels. In FIG. 2, a detailed structure of the circuit sections 14 is omitted.

The first substrate 10 is formed with a first insulating layer 15 that covers the circuit sections 14. The first insulating layer 15 functions as a planarizing film. The first insulating layer 15 is made of, for example, acrylic resin or polyimide resin.

As illustrated in FIG. 2, the display device 1 includes a second insulating layer 16 formed on the first insulating layer 15. The second insulating layer 16 has concave portions 16b in the respective pixels. The second insulating layer 16 has a bank 16a in a boundary of the two adjacent pixels, and an area between the two banks 16a forms the concave portion 16b. Each of the concave portions 16b has a curved surface. In other words, a side surface of the bank 16a is curved. A surface of the concave portion 16b may not be curved over the entire area. For example, each of the concave portions 16b may have a flat surface in the center thereof. Preferably, the concave portions 16b each have a shape and a size corresponding to a light emitting area of each pixel in a plan view of the first substrate 10. In the described example, the concave portions 16b are rectangular in a plan view of the first substrate 10. The shape of the concave portions 16b is not limited to this configuration. For example, the respective pixels may be rectangular, and the concave portions 16b may be circular. Also, the size of the concave portions 16b may be smaller than the light emitting area of each pixel. In this case, plural concave portions 16b may be formed in one pixel.

In an example, surfaces of the concave portions 16b of the second insulating layer 16 are curved in a cross-section taken along one of the two directions orthogonal to each other, and present along the first substrate, and not curved in a cross-section taken along the other direction. In the display device 1 illustrated in this example, the surface of each concave portion 16b in the second insulating layer 16 is curved in the cross-section taken along a direction (horizontal direction) of the scanning lines 11 as illustrated in FIG. 2, and is not curved in the cross-section taken along a direction (vertical direction) of the video signal lines 12 as illustrated in FIG. 3. As will be described later, the concave portions 16b are formed with an OLED section 30. For that reason, in the concave portions 16b having the curved surface described above, the brightness and the chromaticity of the display device 1 can be restrained from being changed when a viewing angle of a user is changed to the horizontal direction. The structure of the concave portions 16b in the second insulating layer 16 is not limited to the above example. For example, the surface of each concave portion 16b in the second insulating layer 16 may be curved in both of a cross-section taken along the horizontal direction and a cross-section taken along the vertical direction.

The second insulating layer 16 is made of material such as polyimide resin or acrylic resin. The material of the second insulating layer 16 may be identical with the material of the first insulating layer 15, or may be different from the material of the first insulating layer 15. If the material of the second insulating layer 16 is identical with the material of the first insulating layer 15, those layers may form one insulating layer, and the insulating layer may have the banks 16a. The concave portions 16b can be formed by a method of multiple exposure using plural different masks in an exposure process, halftone mask exposure using a mask having a semi-permeable film in the exposure process, or gray tone mask exposure using a diffraction phenomenon by a pattern smaller than the resolution of an exposure machine.

The OLED section 30 has lower electrodes 31 in the respective pixels. As illustrated in FIG. 2, the lower electrodes 31 are formed in the above-mentioned concave portions 16b formed in the respective pixels, and curved along the surfaces of the concave portions 16b. As illustrated in FIG. 3, each of the lower electrodes 31 is connected to the circuit section 14 through a contact hole h formed in the first insulating layer 15 and the second insulating layer 16. Specifically, each of the lower electrodes 31 is connected to the drive TFT provided in the circuit section 14. The display device 1 in this example is a top emission type. Therefore, the lower electrodes 31 is made of a material having reflectivity of light (for example, the material is metal such as Al or Ag). Also, lower electrodes 31 may have a stacked structure. That is, the lower electrodes 31 may include a transparent conductive film made of ITO (indium tin oxide) or IZO (indium zinc oxide), and a reflective film made of material having the reflectivity.

The OLED section 30 includes the organic EL layer 32 and an upper electrode 33. The organic EL layer 32 includes a hole injection layer, a hole transport layer, a light emitting layer, an electron transport layer, and an electron injection layer. The upper electrode 33 is made of a transparent conductive film containing ITO or IZO that transmits light.

The organic EL layer 32 is formed on the lower electrode 31, and the upper electrode 33 is formed on the organic EL layer 32. An insulating layer is formed on the fringe of each lower electrode 31, and the organic EL layer 32 may be formed on the insulating layer. The organic EL layer 32 and the upper electrode 33 are curved in each pixel. That is, the organic EL layer 32 and the upper electrode 33 have the curved portions curved in a cross-sectional view of the display device 1 in each pixel. The organic EL layer 32 and the upper electrode 33 are curved in an arcuate shape. The respective curves of the organic EL layer 32 and the upper electrode 33 are continuous from one sides to the other sides of the respective pixels. In the display device 1 illustrated in this example, the concave portions 16b are formed in the insulating layer 16 as described above. The organic EL layer 32 is formed along the surfaces of the concave portions 16b in the respective pixels, and curved so that the light emitting surfaces (surfaces from which light is emitted) are concaved. The upper electrode 33 is also curved along the surfaces of the concave portions 16b in the respective pixels, and concaved. With the organic EL layer 32 thus curved, as compared with a structure in which the organic EL layer is flat, the light is emitted from the organic EL layer 32 even in directions oblique to the display device 1. Also, since the organic EL layer 32 is curved to be concaved, for example, as compared with a structure in which the organic EL layer 32 is curved to be swelled toward the second substrate 20, the light emitted from the organic EL layer 32 can restrained from being mixed with light of an adjacent pixel. It is preferable that the organic EL layer 32 has a substantially uniform thickness in the concave portions 16b. The surface (inner surface) of the concave portions 16b in the insulating layer 16 is curved in an arcuate shape, and the curvature is continuous from one side to the other side of each pixel. The organic EL layer 32 and the upper electrode 33 may not always have the convex portions in all of the pixels. For example, the organic EL layer 32 and upper electrode 33 may have the convex portions only in one color or two colors of pixels among three colors of pixels different from each other. When the display device has the pixels of four colors different from each other, the organic EL layer 32 and the upper electrode 33 may have the convex portions in only the pixels of one color, two colors, or three colors.

An example of the organic EL layer 32 emits a white light. That is, the example of the organic EL layer 32 has a structure in which respective three light emitting layers that emit a red light, a green light, and a blue light are laminated on each other.

Also, another example of the organic EL layer 32 may have a red light emitting layer, a green light emitting layer, and a blue light emitting layer in the red pixel Px(R), the green pixel Px(G), and the blue pixel Px(B), respectively. In this case, the organic EL layer 32 may have a micro cavity structure. That is, a space (in other words, thickness of the organic EL layer 32) between the lower electrode 31 and the upper electrode 33 in each of the pixels may be set according to a spectrum peak of the light emission color of each pixel.

In general, in the micro cavity structure, the chromaticity and brightness of the display device are likely to have a viewing angle dependence. In this embodiment, since the OLED section 30 is curved to match the surface of the concave portion 16b formed in the second insulating layer 16, the light emission efficiency can be improved while suppressing such an angle dependency. The structure that obtains the micro cavity effect is not limited to the configuration described above. For example, a transparent electrode layer may be formed between the organic EL layer 32 and the lower electrodes 31. The thickness of the transparent electrode layer in each of the pixels may be set according to the spectrum peak of the light emission color of that pixel.

Also, when the organic EL layer 32 has the micro cavity structure, the curvature (in other words, the curvature of the concave portion 16b surfaces) of the organic EL layer 32, the width (width of the concave portions 16b) of the organic EL layer 32 in the horizontal direction may be different depending on the color of the pixels. With this arrangement, the light emission areas of the red pixel, the green pixel, and the blue pixel can be changed, and are easily optimized according to the display colors of the display device 1.

As described above, the display device 1 has the second substrate 20 facing the first substrate 10. The display device 1 described in this example has a top-emission type, and the second substrate 20 is made of a translucent material such as glass or plastic. As illustrated in FIG. 2, the second substrate 20 has the color filter layer 22. The color filter layer 22 has color filters 22r, 22g, and 22b in the red pixel Px(R), the green pixel Px(G), and the blue pixel Px(B), respectively. According to this structure, an influence on the organic EL layer 32 (for example, the penetration of moisture through the organic EL layer) in forming the color filters 22r, 22g, and 22b can be suppressed.

The color filters 22r, 22g, and 22b are curved to match the curved portions of the organic EL layer 32. In other words, the color filters 22r, 22g, and 22b each have a curved portion curved along the curved portion of the organic EL layer 32. With this configuration, a difference between a distance by which a light L1 emitted from the organic EL layer 32 in a direction perpendicular to the first substrate 10 passes through the color filters 22r, 22g, and 22b, and a distance by which a light L2 emitted in a direction oblique to the first substrate 10 passes through the color filters 22r, 22g, and 22b can be reduced. As a result, the change in the chromaticity and brightness of the display device 1 depending on the viewing angle of the user can be suppressed.

In the second substrate 20 described in this example, an underlayer 21 is formed. The color filters 22r, 22g, and 22b are formed on the first substrate 10 side of the underlayer 21. The underlayer 21 has convex portions 21a facing the concave portions 16b formed in the second insulating layer 16 in the respective pixels. The surfaces of the convex portions 21a have curved surfaces curved to match the surfaces of the concave portions 16b of the second insulating layer 16. The color filters 22r, 22g, and 22b are formed on the surface of the first substrate 10 side of the convex portions 21a. That is, the color filters 22r, 22g, and 22b are formed on the curved surfaces of the convex portions 21a. With this configuration, the color filters 22r, 22g, and 22b are curved to match the organic EL layer 32 formed in the first substrate 10. The color filters 22r, 22g, and 22b each have a substantially uniform thickness. The overall color filters 22r, 22g, and 22b may be covered with an overcoat layer.

As described above, the surfaces of the concave portions 16b are curved in the cross-section taken along the horizontal direction, and are not curved in the cross-section taken along the vertical direction as illustrated in FIG. 2. Therefore, as illustrated in FIG. 2, the surfaces of the convex portions 21a are also curved to be swelled toward the first substrate 10 in the cross-section taken along the horizontal direction, and not curved to be swelled in the cross-section taken along the vertical direction.

The surfaces of the concave portions 16b of the second insulating layer 16 may be curved in both of the cross-section taken along the horizontal direction, and the cross-section taken along the vertical direction. In this case, the surfaces of the convex portions 21a are curved to be swelled toward the first substrate in both of the cross-section taken along the horizontal direction, and the cross-section taken along the vertical direction.

The underlayer 21 is made of a transparent material. For example, the underlayer 21 is made of a transparent resin such as polyimide resin or acrylic resin. The convex portions 21a of the underlayer 21 can be formed by, for example, a method of multiple exposure, halftone mask exposure, or gray tone mask exposure, as in the concave portions 16b of the second insulating layer 16. The convex portions 21a may not be formed on the underlayer 21. For example, the convex portions 21a may be formed on the second substrate 20 per se.

The size of the convex portions 21a in a plan view of the substrates 10 and 20 are preferably smaller than the size of the concave portions 16b of the first substrate 10. Specifically, as illustrated in FIG. 2, a width W2 of the convex portions 21a in the horizontal direction is smaller than a width W1 of the concave portions 16b in the horizontal direction. Also, as illustrated in FIG. 3, a width W4 of the convex portions 21a in the vertical direction is smaller than a width W3 of the concave portions 16b in the vertical direction. With this configuration, a distance between the organic EL layer 32, and the color filters 22r, 22g, and 22b can be reduced. As a result, the distance by which the light emitted from the organic EL layer 32 passes through the color filters 22r, 22g, and 22b is easily restrained from being changed according to the angle of the light. Preferably, as illustrated in FIGS. 2 and 3, when viewed from the cross-section of the display device 1, the color filters 22r, 22g, and 22b, and the OLED section 30 overlap with each other in the horizontal direction and the vertical direction. That is, lower ends of the color filters 22r, 22g, and 22b are located below an upper end of the OLED section 30. A positional relationship between the color filters 22r, 22g, and 22b, and the OLED section 30 is not limited to this example. That is, when viewed from the cross-section of the display device 1, the color filters 22r, 22g, and 22b, and the OLED section 30 may not overlap with each other in the horizontal direction and the vertical direction. The curved portions of the organic EL layer 32 may not always been disposed in all of the pixels. In this case, the curved portions of the color filters 22r, 22g, and 22b are disposed in only the pixel in which the organic EL layer 32 has the curved portion.

As illustrated in FIG. 2, in the example of the display device 1, a black matrix 23 that partitions the respective pixels is formed between two adjacent color filters. As a result when the display device 1 is obliquely viewed, the light of the two adjacent pixels can be more effectively prevented from being mixed together. In this embodiment, the organic EL layer 32 is curved to be concaved. In this structure, as compared with a structure in which the organic EL layer 32 is swelled, the light emitted from the organic EL layer 32 is restrained from penetrating into the color filter of the adjacent pixel. Therefore, the black matrix 23 is not always formed.

A filler 17 is disposed between the stacked structure formed in the first substrate 10, and the stacked structure formed in the second substrate 20. The filler 17 is made of a material such as synthetic resin having fluidity and being hardenable. For example, the filler 17 is laminated on the upper electrode 33 of the first substrate 10 in a state where the filler 17 has the fluidity. Thereafter, the first substrate 10 and the second substrate 20 are bonded together, and after a distance between the color filters 22r, 22g, and 22b, and the organic EL layer 32 reaches a predetermined distance, the filler 17 hardens by heat.

Figure 4:
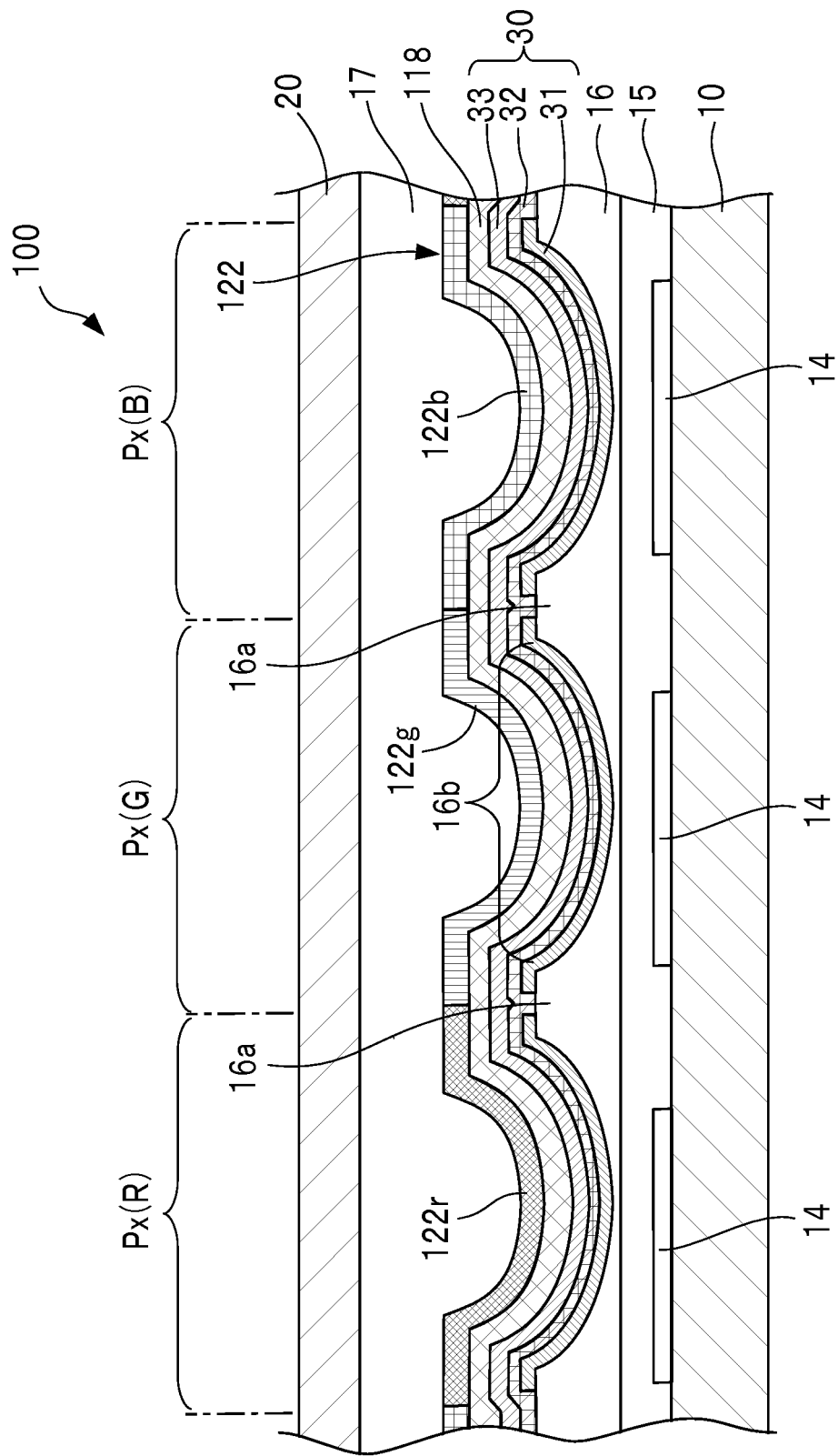
FIG. 4 is a cross-sectional view illustrating one modification of the present invention.

FIG. 4 is a cross-sectional view illustrating a display device 100 according to one modification of the present invention. The cross-section of this drawing is identical with that of FIG. 2. In FIG. 4, the same parts as those described above are denoted by the identical symbols. Hereinafter, differences from the display device 1 described above will be described, and the other configurations are identical with those in the display device 1.

In the display device 100, as with the display device 1, a first insulating layer 15, a second insulating layer 16, and an OLED section 30 are formed on a first substrate 10. In the display device 100, a color filter layer 122 is formed on the first substrate 10. The color filter layer 122 has color filters 122r, 122g, and 122b in a red pixel Px(R), a green pixel Px(G), and a blue pixel Px(B), respectively. The color filters 122r, 122g, and 122b, and the organic EL layer 32 are laminated on each other, and curved to match the concave portions 16b of the second insulating layer 16 in the respective pixels. According to this structure in which the color filters 122r, 122g, and 122b are also formed on the first substrate 10, a distance between the color filters 122r, 122g, and 122b, and the organic EL layer 32 can be further reduced. A filler 17 is arranged between the second substrate 20 and the laminated structure (specifically, the first insulating layer 15 to color filter layer 122) of the first substrate 10. The curved color filters and the curved OLED section 30 do not always have the curved portion in all of the pixels. For example, the color filters and the OLED section 30 may have the curved portion in only one color or two colors of pixels among the pixels of three colors different from each other. When the display device has the pixels of four colors different from each other, the color filters and the OLED section 30 may have the curved portions in only the pixels of one color, two colors, or three colors.

In the display device 100, a protective film 118 is formed on the second substrate 20 side of the OLED section 30. The protective film 118 covers the OLED section 30. The color filters 122r, 122g, and 122b are formed on the protective film 118. The protective film 118 is provided, for example, for the purpose of preventing moisture from penetrating into the OLED section 30, or for protecting the OLED section 30 from the moisture of the filler 17, at the time of forming the color filters 122r, 122g, and 122b (for example, at the time of wet edging). The protective film 118 is made of a material excellent in moisture-proof property such as silicon nitride (SiN).

Figure 5:
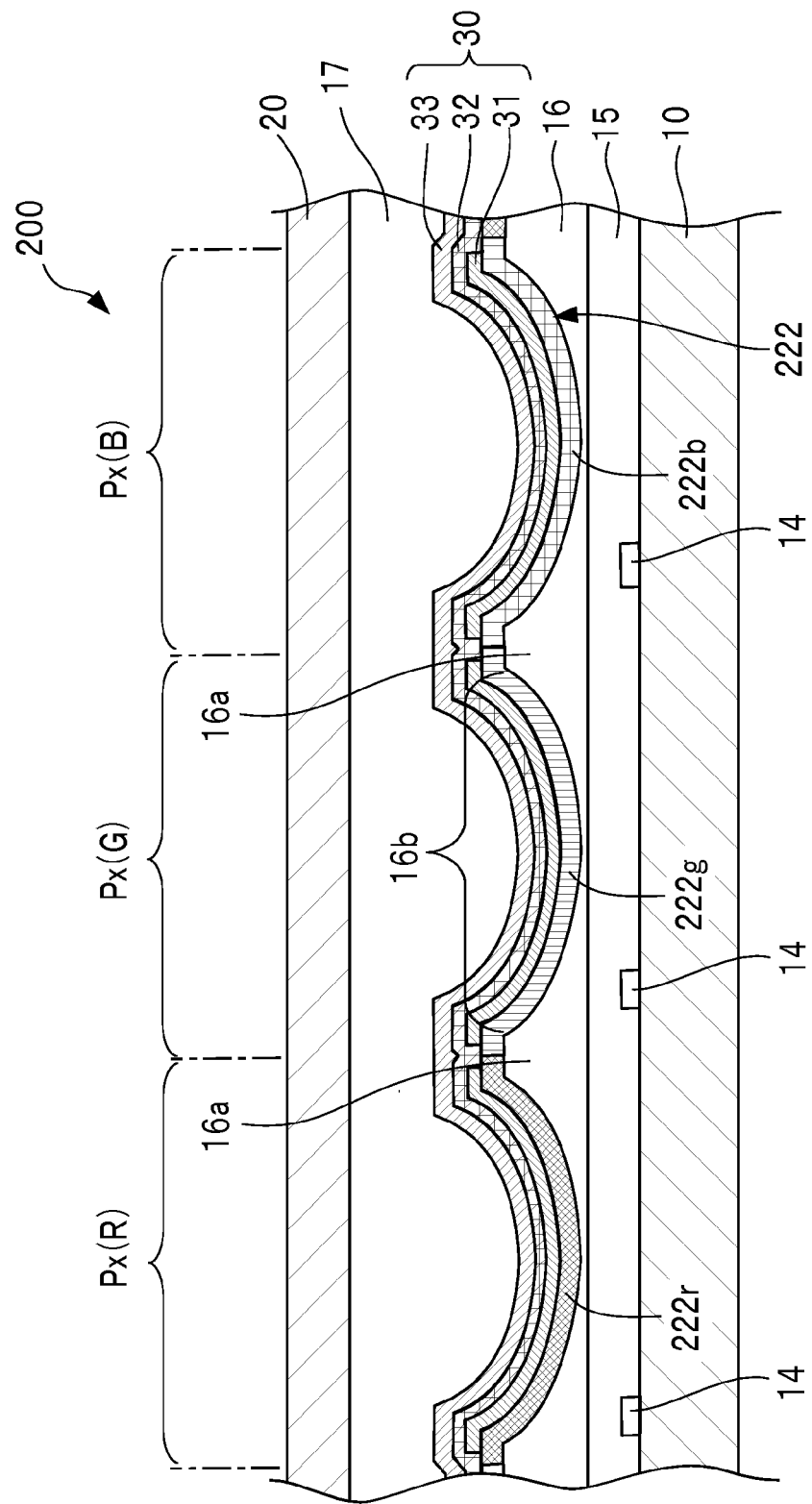
FIG. 5 is a cross-sectional view illustrating another modification of the present invention.

FIG. 5 is a cross-sectional view illustrating a display device 200 according to another modification of the present invention. The cross-section of this drawing is identical with that of FIG. 2. In FIG. 5, the same parts as those described above are denoted by identical symbols. Hereinafter, differences from the display device 100 described above will be described, and the other configurations are identical with those in the display device 100.

In the display device 200, as with the display device 100, a first insulating layer 15 and a second insulating layer 16 are formed on a first substrate 10. A OLED section 30 and a color filter layer 222 are further laminated on the first substrate 10 of the display device 200. The color filter layer 222 has color filters 222r, 222g, and 222b in a red pixel Px(R), a green pixel Px(G), and a blue pixel Px(B), respectively. The display device 200 is of a bottom emission type different from the display device 100. Therefore, in the display device 200, the color filter layer 222 is formed on the first substrate 10 side of the OLED section 30. In the example illustrated in FIG. 5, the color filters 222r, 222g, and 222b are formed on the second insulating layer 16, and curved to be concaved according to the surfaces of the concave portions 16b.

The OLED section 30 includes lower electrodes 31, an organic EL layer 32, and an upper electrode 33. The lower electrodes 31 described in this example are formed of a transparent conductive film such as IZO or ITO that transmit light. The lower electrodes 31 is formed on the second substrate 20 side of the color filters 222r, 222g, and 222b, and curved along the surface of the concave portions 16b. The organic EL layer 32 is formed on the lower electrodes 31a, and the upper electrode 33 is formed on the organic EL layer 32. The upper electrode 33 is connected to the circuit sections 14 through a contact hole formed in the first insulating layer 15 and second insulating layer 16. The upper electrode 33 is made of, for example, a material having reflectivity of light (for example, the material is metal such as Al or Ag). Also, the upper electrode 33 may have a laminated structure having a transparent conductive film such as ITO or IZO, and a reflective film made of a material having the reflectivity.

The present invention is not limited to the display devices 1, 100, and 200 described above, but can be variously changed.

For example, in the display devices 1, 100, and 200, the organic EL layer 32 is curved to match the surfaces of the concave portions 16b of the second insulating layer 16. However, the second insulating layer 16 has the convex portions in the respective pixels, and the surfaces of the convex portions may be curved to be swelled toward the second substrate 20. The color filters are formed on the second substrate 20 side of the convex portions, and curved to match the surfaces of the convex portions. Even in this structure, a difference between the distance by which the light emitted from the organic EL layer 32 in the direction perpendicular to the first substrate 10 passes through the color filters, and the distance by which the light emitted in the direction oblique to the first substrate 10 passes through the color filters can be reduced. As a result, the change in the chromaticity and brightness of the display device depending on the viewing angle of the user can be suppressed. In this case, the color filters may be formed on the second substrate 20 as with the display device 1, or may be formed on the first substrate 10 as with the display devices 100 and 200.

What is claimed is:

1. A display device comprising:
    a first substrate having a first side;
    a plurality of lower electrodes on the first side of the first substrate, each of the lower electrodes having a first curved portion in a cross sectional view;
    an organic EL layer on one of the lower electrodes;
    an upper electrode covering the organic EL layer;
    a second substrate having a second side facing the first side;
    a plurality of second curved portions on the second side of the second substrate, one of which is curved to match the first curved portion of the lower electrode in a cross sectional view;
    a color filter on the plurality of second curved portions, and between the plurality of second curved portions and the upper electrode; and
    a black matrix between adjacent second curved portions among the second curved portions on the second substrate; wherein
    a distance between a lower surface of the black matrix and the first side is greater than a distance between the one of the plurality of second curved portions and the first side.

2. The display device according to claim 1,
    wherein the organic EL layer has a light emitting surface that emits light to a side corresponding to a display surface of the display device,
    the first curved portion of the lower electrode is curved to concave the light emitting surface, and
    the second curved portion on the second substrate is curved to convex the color filter.

3. The display device according to claim 1,
    wherein the width of the one of the plurality of second curved portions is smaller than that of the first curved portion in a plan view.

4. The display device according to claim 2,
    wherein lower ends of each of the plurality of second curved portions are positioned lower than an upper end of the first curved portion in a cross sectional view.

5. The display device according to claim 1, further comprising:
    an insulating layer on the first substrate; and
    an insulating layer on the second substrate,
    wherein
    the insulating layer on the second substrate includes the plurality of second curved portions,
    the insulating layer on the first substrate includes a third curved portion, and
    the first curved portion curved to match the third curved portion is formed on the third curved portion.

6. The display device according to claim 1, further comprising:
    a filler between the color filter and the upper electrode.

* * * * *